United States Patent [19]
Minich

[11] Patent Number: 5,897,388
[45] Date of Patent: Apr. 27, 1999

[54] METHOD OF APPLYING ESD PROTECTION TO A SHIELDED ELECTRICAL

[75] Inventor: Steven E. Minich, Carlisle, Pa.

[73] Assignee: The Whitaker Corporation, Wilmington, Del.

[21] Appl. No.: 08/866,477

[22] Filed: May 30, 1997

[51] Int. Cl.[6] .................................................. H01R 13/53
[52] U.S. Cl. ............................ 439/181; 439/77; 439/607
[58] Field of Search ............................... 439/92, 95, 181, 439/607, 609, 620, 77

[56] References Cited

U.S. PATENT DOCUMENTS

| | | | |
|---|---|---|---|
| 4,412,715 | 11/1983 | Bogese, II . | |
| 4,813,891 | 3/1989 | Walters et al. | 439/620 |
| 4,977,357 | 12/1990 | Shrier | 338/21 |
| 4,992,333 | 2/1991 | Hyatt | 428/402 |
| 5,068,634 | 11/1991 | Shrier | 338/21 |
| 5,099,380 | 3/1992 | Childers et al. | 361/56 |
| 5,142,263 | 8/1992 | Childers et al. | 338/21 |
| 5,183,698 | 2/1993 | Stephenson et al. | 428/209 |
| 5,189,387 | 2/1993 | Childers et al. | 338/20 |
| 5,246,388 | 9/1993 | Collins et al. | 439/620 |
| 5,248,517 | 9/1993 | Shrier et al. | 427/58 |
| 5,260,848 | 11/1993 | Childers | 361/127 |
| 5,262,754 | 11/1993 | Collins | 338/21 |
| 5,269,705 | 12/1993 | Iannella et al. | 439/620 |
| 5,278,535 | 1/1994 | Xu et al. | 338/20 |
| 5,340,641 | 8/1994 | Xu | 428/209 |
| 5,393,597 | 2/1995 | Childers et al. | 428/242 |
| 5,476,714 | 12/1995 | Hyatt | 428/402 |
| 5,483,407 | 1/1996 | Anastasio et al. | 361/56 |

FOREIGN PATENT DOCUMENTS

| | | | |
|---|---|---|---|
| 0 476 702 A2 | 3/1992 | European Pat. Off. | H01R 13/66 |
| 0 666 705 A2 | 8/1995 | European Pat. Off. | H05K 5/02 |

OTHER PUBLICATIONS

PCT International Search Report, PCT/US98/10351, dated Aug. 26, 1998.

*Primary Examiner*—Khiem Nguyen

[57] ABSTRACT

An assembly and method of assembling a connector is described. The connector assembly includes a housing having a plurality of signal contacts projecting therefrom. A shell is removably connected to the housing, the shell member including a pair of shell tabs for connecting the shell member to the housing member. A flexible circuit is soldered to the plurality of signal contacts of the housing member. The flexible circuit is wrapped against the housing and bent at a portion thereof for insertion into a gap formed between the housing and the shell. A protective material is positioned between the flexible circuit and the shell member, and the connector is secured by bending shell tabs of the shell around the housing member. Assembly of the connector includes applying the flexible circuit to the plurality of signal contacts of the housing member, folding a portion of the flexible circuit under the housing member into a gap formed by the separation of the housing from the shell, positioning a protective material between the remaining ends of the flexible circuit and the shell, and compressing the flexible circuit and the protective material between the housing and the shell by bending the shell tabs around the housing.

14 Claims, 4 Drawing Sheets

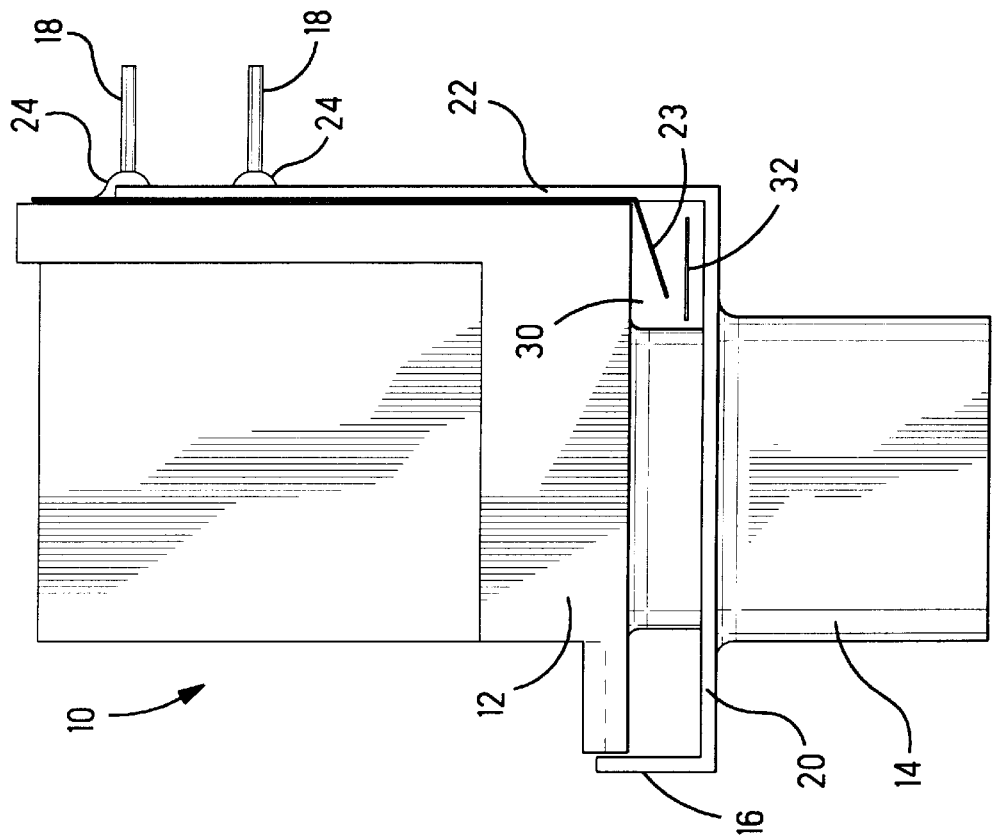
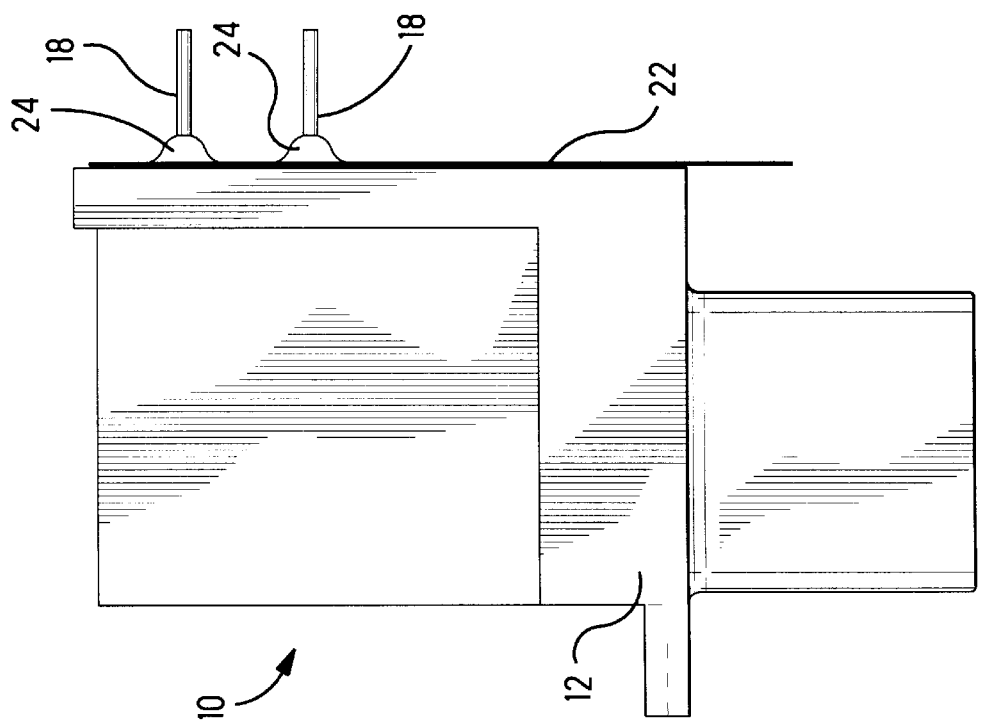

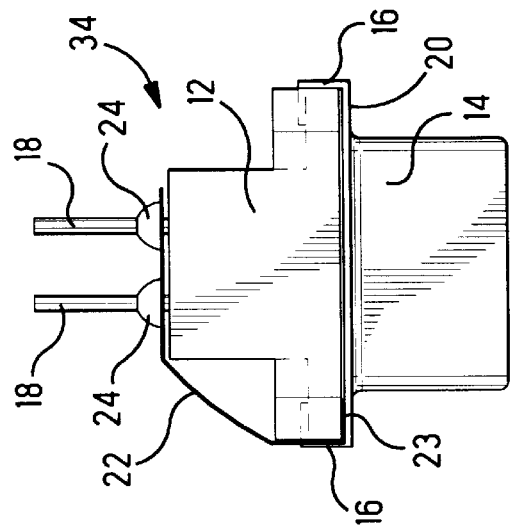
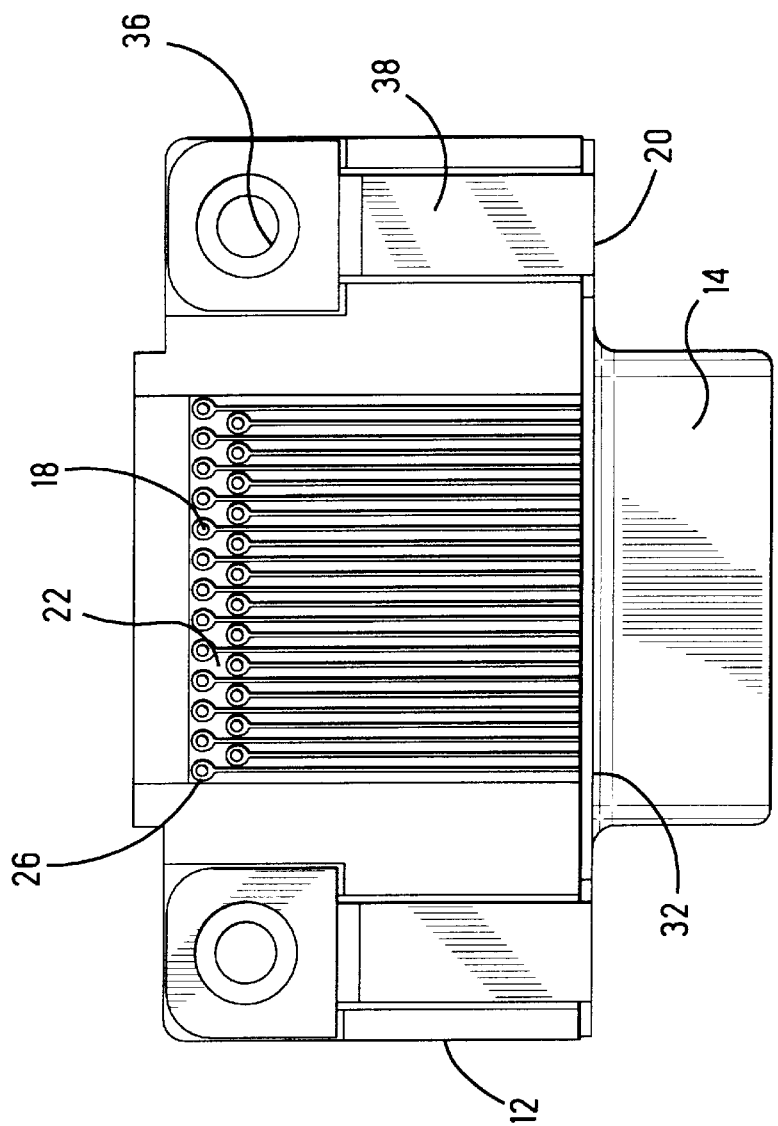

5,897,388

METHOD OF APPLYING ESD PROTECTION TO A SHIELDED ELECTRICAL

FIELD OF THE INVENTION

The present invention relates to an improved method and apparatus for applying electrostatic discharge (ESD) protection to a shielded electrical connector. More particularly, the present invention relates to an improved method and apparatus for applying ESD protection to a shielded connector in which a flexible circuit is combined with either a vertical or right angle connector assembly.

BACKGROUND OF THE INVENTION

In the art of ESD protected connectors, there are known assemblies in which the connectors use a polymer based protective material which provides ESD protection, such as a POLYCLAMP material (POLYCLAMP is a trademark of AMP Incorporated), between traces on a printed circuit board and a ground plate of the connector. The current manufacturing process includes placing the POLYCLAMP material in an uncured state between traces on the printed circuit board and the ground plate. These components are fixtured as the POLYCLAMP material is compressed between the ground plate and the printed circuit board during an oven cure process. This creates a bond between the POLYCLAMP material and the traces on the printed circuit board. Next, the fixturing is removed and the printed circuit board/POLYCLAMP material/ground subassembly is soldered to pins and a shell of a connector subassembly. Disadvantageously, the cost of manufacturing is high, the required components include use of the printed circuit board, and an oven cure process is used. Accordingly, a need in the art exists for an improved connector and an assembly therefore which is low in cost and easy to manufacture.

SUMMARY OF AN EMBODIMENT OF THE INVENTION

The present invention provides a method of assembling a shielded electrical connector.

The present invention also provides a method of assembling a shielded electrical connector which eliminates the use of a printed circuit board.

The present invention provides a method of assembling a shielded electrical connector which modifies an existing connector to take advantage of manufacturing economies of scale.

An embodiment of the present invention comprises a method of applying ESD protection to a shielded electrical connector assembly, said shielded electrical connector assembly including a housing, a plurality of signal contacts projecting from the housing, and a shell. The shell includes a grounding shield. The method comprises the steps of electrically connecting a flexible circuit to the plurality of signal contacts of the housing, folding a portion of the flexible circuit against the housing. The method further comprises mating the shell to the housing to within a distance defining a gap formed by a predetermined spacing of the housing from the shell and positioning a protective material within the gap and between the flexible circuit and the shell. The method further comprises closing the gap defined between the shell and the housing thereby capturing the flexible circuit and the protective material between the housing and the shell and securing the shell to the housing.

An embodiment of the present invention also comprises a connector assembly including ESD protection, the connector assembly comprising a housing having a plurality of signal contacts projecting therefrom, a shell connectable to said housing, said shell including a grounding shield. The connector further comprises a flexible circuit electrically connected to the plurality of signal contacts of said housing, the flexible circuit being wrapped against the housing and disposed between the housing and the shell. The protective material is positioned between the flexible circuit and the shell and securing members affix the shell to the housing.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 1 is a side view of a housing subassembly for a right angle connector illustrating a first step of applying a flexible circuit thereto;

FIG. 2 is a side view of a front shell being applied to the housing subassembly for the right angle connector of FIG. 1;

FIG. 4B is a front view of the right angle connector at the stage of assembly shown in FIG. 4A;

FIG. 5 is a side view of a vertical connector having the flexible circuit applied thereto.

DETAILED DESCRIPTION OF AN EMBODIMENT OF THE INVENTION

Figure 4A:
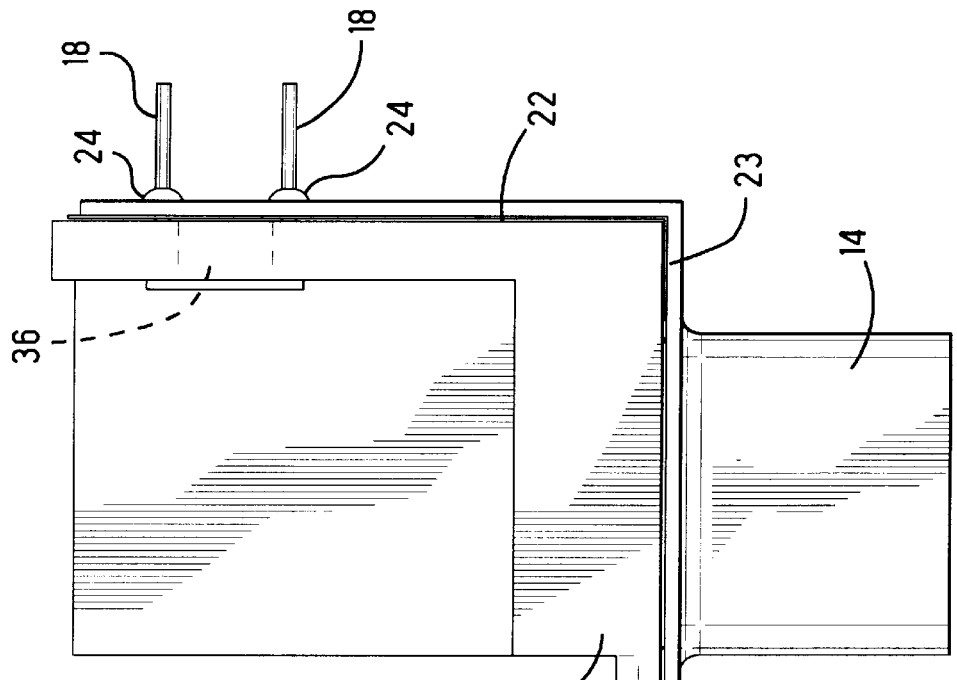
FIG. 4A is a side view of the right angle connector of FIG. 1 illustrating a fourth step of applying the flexible circuit thereto.

In the drawings, like parts contain corresponding reference numerals throughout this detailed description of the invention.

By way of explanation, the connector of the present invention includes certain features in order to complete the later disclosed assembly. Specifically, the connector is generally shown as element 10 in the drawing figures. The connector 10 typically includes an insulated plastic housing 12 and a metal shell 14. The metal shell 14 is removably secured to the housing 12 by the use of securing members or shell tabs 16 as shown.

A plurality of signal contacts 18 extend from a predetermined face of the housing 12, the forward ends of the contacts 18 being contained within the housing 12. Also typical of connectors such as 10 is the provision of a grounding shield 20, made of metal that extends as a flange around the periphery of the metal shell 14 and adjoins the housing 12 upon assembly of the shell 14 with the housing 12. Although the grounding shield 20 is separately described, it should be understood that the grounding shield 20 is integrally formed with the shell 14 and as such the entire shell/grounding shield combination provides grounding for the connector 10. A pair of eyelets 36 are tethered by strips 38 to the flanged portion 20 of the shell 14 and are formed to be continuous extensions of the shell 14. The pair of eyelets 36 are inserted or riveted through a face of the housing 12 having the signal contacts 18 protruding therefrom such that the eyelets 36 are adjacent to the signal contacts 18.

Each of the plurality of signal contacts 18 typically include pins that fit through holes or apertures in printed circuit boards and are soldered thereto to join with the traces of such boards and be interconnected to the components on the board. In the present invention, however, the signal contacts 18 are connected to a flexible circuit 22 as will be further described in the following.

Figure 6:
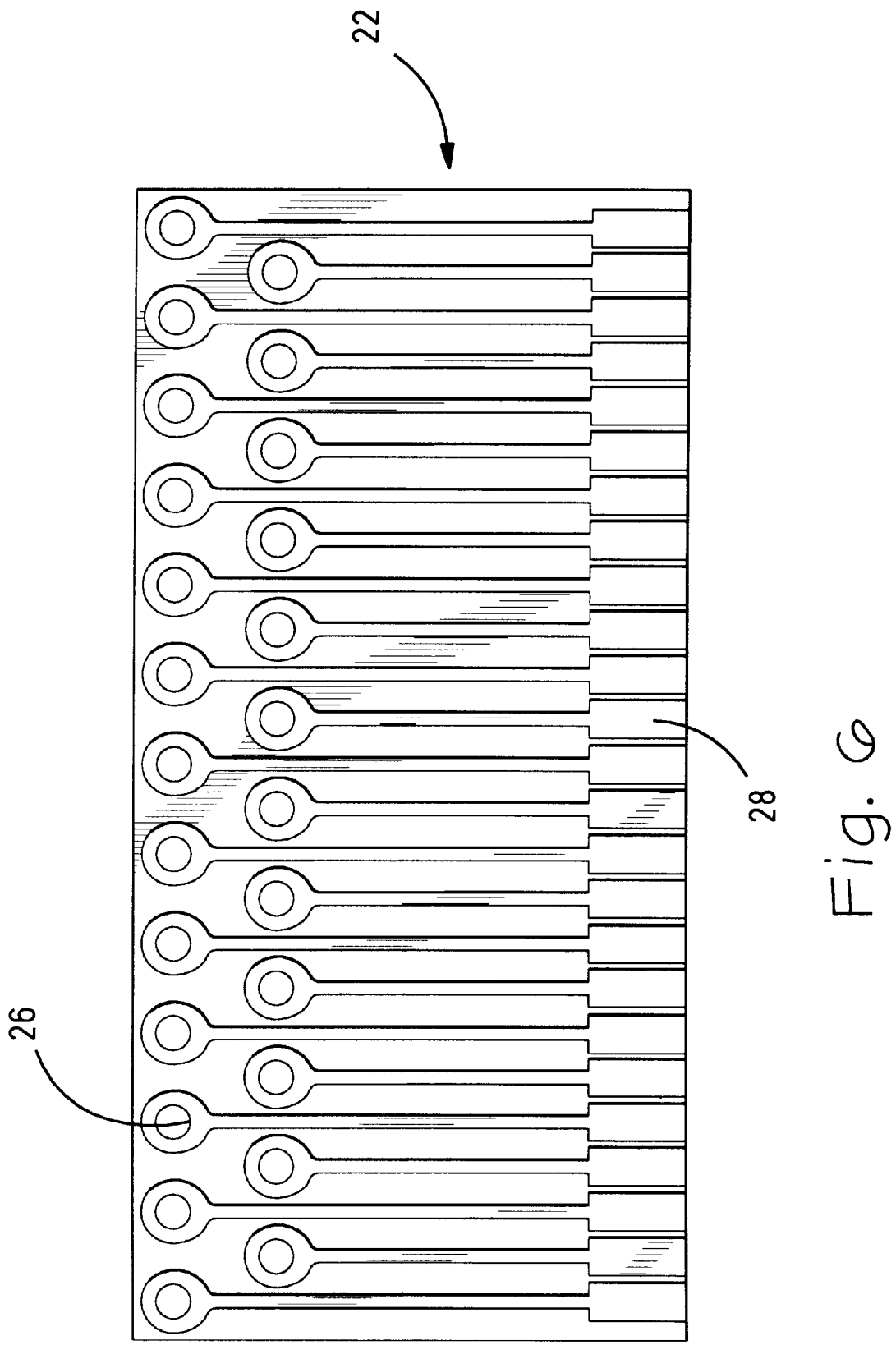
FIG. 6 is a top plan view of an exemplary flexible circuit for use in either a vertical or right angle connector of the present invention.

The flexible circuit 22 is shown in detail in FIG. 6 and includes a plurality of pads 26 and a corresponding plurality of integral traces 28 for connection to the signal contact pins 18 of the connector 10. In addition, an ESD protective material 32 is used which is placed between the flexible circuit 22 and the housing 12 for compression therebetween. The protective material 32 is a silicone based material which provides ESD protection to the connector through quantum mechanical tunneling and is, by way of example, a POLYCLAMP material.

The method of assembly of the connector will now be described in connection with the parts of the assembled connector as set forth above.

With specific reference to FIG. 1, the flexible circuit 22 is applied to the housing subassembly 12, including the signal pin contacts 18 by soldering each pin 18 to a corresponding pad 26 at solder fillet 24 on the flexible circuit 22, respectively. As indicated, the flexible circuit 22 also includes the traces 28 corresponding in number and connected to or formed with, the plurality of pads 26.

Figure 3:
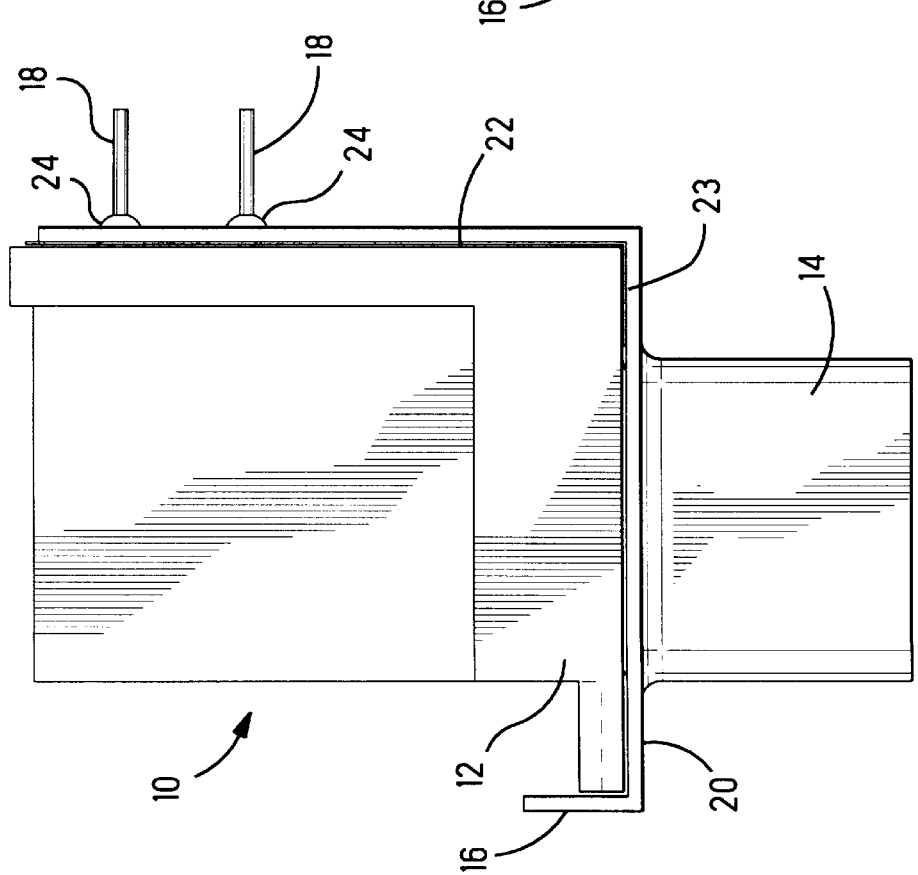
FIG. 3 is a side view of the right angle connector of FIG. 1 illustrating a third step of applying a flexible circuit thereto.

As shown in FIG. 2, the flexible circuit 22 is wrapped against the housing 12 to form a bent portion 23. A substantial portion of the flexible circuit is laid along a facing wall of the housing 12 and the bent portion wraps or folds under a portion of the housing 12 for insertion into a gap 30 formed between the shell 14 and the housing 12. As shown in FIG. 2, the piece of ESD protection material 32, such as a rectangular piece of POLYCLAMP material, is placed between the traces 28 on the bent portion 23 of the flexible circuit 22 and the shell 14. The metal shell 14 is applied to the housing subassembly 12 by mating with a complementary shaped portion of the housing 12. This joining of the housing subassembly 12 with the metal shell 14 compresses the bent portion 23 of the flexible circuit 22 and the protective material 32 between the housing 12 and the metal shell 14. The result is shown in FIG. 3.

As shown in FIGS. 4A and 4B, the eyelets 36 are formed through a wall of the housing 12 which supports the signal contacts 18. The eyelets 36 are tethered by strips 38 to the flanged portion 20 of the shell 14. The strips 38 and eyelets 36 are of the same metal material as the remainder of the shell 14 and the flanged portion 20 of the shell 14 and thus have the same grounding properties as the shell 14 and the flanged grounding shield 20. The shell tabs 16 are pressed by bending into a securing position so that the previously described gap 30 is closed and ESD protection material 32 and the flexible circuit 22 are retained between the shell 14 and the housing 12.

Advantageously a device according to the teachings of the present invention has a substantially lower manufacturing cost and a smaller size than prior art connectors. Because the shell 14 exerts a constant pressure on the protective material 32, an oven cure step of the prior manufacturing process and all tooling associated with that prior manufacturing process is eliminated. By the use of the present invention, certain other advantages are obtained. In particular, if a final assembly fails outgoing electrical tests, the shell 14 can simply be displaced upon releasing the shell tabs 16. A new piece of ESD protective material 32 can then be inserted into the gap 30 formed between the separated housing 12 and the shell portion 14. There will be a minimal amount of scrap as a result of the described process.

The invention is also applicable to a vertical connector configuration as shown in FIG. 5. This arrangement was not previously possible prior to the development of the present invention. Like reference numerals again refer to like parts and the view in FIG. 5 is simply intended to show the end result of the assembly process described in FIGS. 1 through 4, as that assembly process would be applied to a vertical connector 34. In the assembly of FIG. 5, the flexible circuit 22 is wrapped around the housing portion 12 to attain insertion of the bent portion 23 between the ESD protection material 32 and the housing 12. Due to the shape of the housing, the flexible circuit is not flush with the housing. The operation and ESD protection feature of the connector, however, are not affected. Instead, it should be understood that the end result is the same in that the flexible circuit 22, having a lower cost and smaller size is applicable to the vertical connector 34 as shown.

In keeping with the inventive features of the present invention, it should be understood that prior concerns in the art regarding connections of a right angle or vertical connector to a printed circuit board are no longer applicable. By the present invention, there is achieved an advantageous and secure arrangement of components which is now suitable for numerous end uses, which is easy to manufacture and low in cost.

The invention having been described, it is clear that certain modifications and variations of the connector and its assembly are possible to one of ordinary skill in the art. Specifically, while a rectangular embodiment of a circuit using the POLYCLAMP material 32 is described, any suitable shape or similar protective material may be used as applicable to the particular connector assembly. Furthermore, the use of the flexible circuit 22 for this particular connector may be expanded to other applications as technology advances.

The use of the flexible circuit is intended to replace the use of the relatively higher cost printed circuit board in certain applications, and as such is also subject to modification by the ordinary skilled artisan. To this end, use of other materials as well as their subassemblies is considered within the purview of the ordinary skilled artisan. These obvious modifications and variations are within the theme and spirit of the invention and are considered within the scope of the following claims.

I claim:

1. A method of applying ESD protection to an electrical connector assembly, said electrical connector assembly including a housing, a plurality of signal contacts projecting from the housing, and a shell, the shell including a grounding shield method comprising the steps of:
    (a) electrically connecting a flexible circuit comprising a plurality of individual circuit traces to corresponding ones of the plurality of signal contacts of the housing;
    (b) folding a portion of said flexible circuit against the housing;
    (c) mating the shell to the housing to within a distance defining a gap formed by a predetermined spacing of the housing from the shell;
    (d) positioning a protective material within said gap and between the flexible circuit and the shell;
    (e) closing said gap between the shell and the housing thereby capturing the flexible circuit and the protective material between the housing and the shell; and (f) securing the shell to the housing.

2. The method according to claim 1, wherein said flexible circuit includes a plurality of pads and a corresponding plurality of trace members, and wherein said step of electrically connecting includes soldering each one of the plurality of pads of the flexible circuit to a corresponding one of the plurality of signal contacts.

3. The method according to claim 2, wherein said step of folding a portion of the flexible circuit between the housing and the shell includes placing the traces of the flexible circuit between the housing and the shell.

4. The method according to claim 1, wherein said protective material is a polymer based material which provides electrostatic discharge protection to the connector through quantum mechanical tunneling.

5. The method according to claim 1, wherein said step of electrically connecting includes soldering said flexible circuit to said plurality of signal contacts.

6. The method according to claim 1, wherein said connector assembly is a vertical connector assembly.

7. The method according to claim 1, wherein said connector assembly is a right angle connector assembly.

8. A connector assembly including ESD protection, said connector assembly comprising:

a housing having a plurality of signal contacts projecting therefrom;

a shell connectable to said housing, said shell including a grounding shield;

a flexible circuit comprising a plurality of individual circuit traces electrically connected to corresponding ones of the plurality of signal contacts of said housing;

said flexible circuit being wrapped against said housing and disposed between said housing and said shell;

protective material positioned between said flexible circuit and said shell; and securing members affixing said shell to said housing.

9. The assembly according to claim 8, wherein said flexible circuit includes a plurality of pads and a corresponding plurality of traces, and wherein each one of the plurality of pads of the flexible circuit is soldered to a corresponding one of said plurality of signal contacts.

10. The assembly according to claim 9, wherein at least a portion of the plurality of traces of said flexible circuit are disposed between said housing and said shell.

11. The assembly according to claim 10, wherein said securing members comprise bendable shell tabs on said shell to secure said housing to said shell.

12. The assembly according to claim 8, wherein said connector assembly is a vertical connector assembly.

13. The assembly according to claim 8, wherein said connector assembly is a right angle connector assembly.

14. The assembly according to claim 8, wherein said protective material is a polymer based material which provides electrostatic discharge protection to the connector through quantum mechanical tunneling.

* * * * *